(12) United States Patent
Arita

(10) Patent No.: US 7,923,351 B2
(45) Date of Patent: Apr. 12, 2011

(54) MANUFACTURING METHOD OF SEMICONDUCTOR DEVICES

(75) Inventor: Kiyoshi Arita, Fukuoka (JP)

(73) Assignee: Panasonic Corporation, Osaka (JP)

( * ) Notice: Subject to any disclaimer, the term of this patent is extended or adjusted under 35 U.S.C. 154(b) by 98 days.

(21) Appl. No.: 11/576,363

(22) PCT Filed: Jul. 10, 2006

(86) PCT No.: PCT/JP2006/314114
§ 371 (c)(1),
(2), (4) Date: Mar. 30, 2007

(87) PCT Pub. No.: WO2007/007883
PCT Pub. Date: Jan. 18, 2007

(65) Prior Publication Data
US 2009/0209087 A1      Aug. 20, 2009

(30) Foreign Application Priority Data

Jul. 11, 2005 (JP) .................................. 2005-201536

(51) Int. Cl.
*H01L 21/463* (2006.01)
*H01L 21/467* (2006.01)
*H01L 21/78* (2006.01)

(52) U.S. Cl. .. 438/463; 438/464; 438/691; 257/E21.602
(58) Field of Classification Search .......... 438/460–465, 438/113, 33, 68; 257/E21.001, E21.599
See application file for complete search history.

(56) References Cited

U.S. PATENT DOCUMENTS

| 5,963,816 | A  | * | 10/1999 | Wang et al. ................... 438/401 |
| 6,225,193 | B1 | * | 5/2001 | Simpson et al. ............... 438/460 |
| 6,897,128 | B2 | * | 5/2005 | Arita ............................. 438/460 |
| 2008/0153283 | A1 | * | 6/2008 | Abdelrahman et al. ...... 438/618 |

FOREIGN PATENT DOCUMENTS

| JP | 2004-172364 | 6/2004 |
| WO | 2004/047165 | 6/2004 |

* cited by examiner

*Primary Examiner* — Stephen W Smoot
(74) *Attorney, Agent, or Firm* — Pearne & Gordon LLP

(57) ABSTRACT

In a method of manufacturing semiconductor chips by dicing individual semiconductor devices from a semiconductor wafer, masks formed for plasma dicing in which a semiconductor wafer is divided by conducting plasma etching are removed by mechanical grinding using a grinding head. Accordingly, by removing the masks for plasma dicing using mechanical grinding, generation of reaction products is prevented when removing the masks, so that the dicing can be conducted without causing quality deterioration due to the accumulated particles.

1 Claim, 6 Drawing Sheets

MANUFACTURING METHOD OF SEMICONDUCTOR DEVICES

BACKGROUND ART

This invention relates to a manufacturing method of semiconductor chips by dicing individual semiconductor devices from a semiconductor wafer in which the semiconductor devices are formed.

The semiconductor chips mounted on boards in electronic devices or the like are manufactured by dicing semiconductor devices into individual pieces from a wafer state in which circuit patterns are formed. Accompanying the increase in difficulty to handle semiconductor devices in a wafer state due to downsizing in thickness of the semiconductor devices, there has been applied in recent years, a plasma dicing where dicing to divide a semiconductor wafer into individual semiconductor chips is conducted by plasma etching (see, for example, JP-A-2004-172364 Publication).

The plasma dicing is performed by conducting a plasma etching in a state that the semiconductor wafer is masked with masks of resist films other than street lines which shows dividing positions in grid patterns, so that the semiconductor wafer is cut along street lines. After dicing, in order to remove masks, a plasma ashing to remove the masks is conducted in the same plasma processing apparatus to conduct the plasma dicing in the conventional art of JP-A-2004-172364 Publication.

However, in the plasma ashing, reaction products generated in removing the masks are scattered into particles and accumulated inside of the plasma processing apparatus. Accordingly, in case that dicing process and ashing process are repeatedly executed in the same plasma processing apparatus, quality deterioration may be caused in a dicing process due to contamination of the semiconductor wafer with the particles accumulated in the plasma processing apparatus.

DISCLOSURE OF THE INVENTION

This invention has been made in view of the above circumstances, and an object of the invention is to provide a manufacturing method of semiconductor chips in which the dicing can be conducted without causing the quality deterioration due to the accumulated particles.

The above object has been achieved by a method of manufacturing semiconductor chips by dicing individual semiconductor devices from a semiconductor wafer in which the semiconductor devices are formed respectively in plural areas partitioned by street lines, comprising the steps of:

a protective tape pasting step of pasting a protective tape, capable of being peeled off, on a semiconductor device forming face of a semiconductor wafer;

a back face grinding step of grinding a back face opposite to the face of the semiconductor wafer on which the protective tape is pasted so as to thin the semiconductor wafer;

a mask forming step of forming masks covering the plural areas on the back face of the semiconductor wafer after the back face grinding step;

a plasma dicing step of dicing the semiconductor wafer into plural semiconductor chips each of which corresponds to an individual semiconductor device by generating plasma from a side of the semiconductor wafer on which the masks are formed to remove a portion of the semiconductor wafer which is not covered with the masks;

a mask removing step of removing the masks by grinding the back face on which the masks are formed after the plasma dicing step;

a damaged layer removing step of removing damaged layers formed on the back face in the mask removing step; and a tape releasing step of releasing the protective tape from the diced semiconductor chips.

According to the present invention, by removing the masks for plasma dicing using mechanical grinding, generation of reaction products is prevented when removing the masks, so that the dicing can be conducted without causing quality deterioration due to the accumulated particles.

BEST MODE FOR CARRYING OUT THE INVENTION

Figure 1:
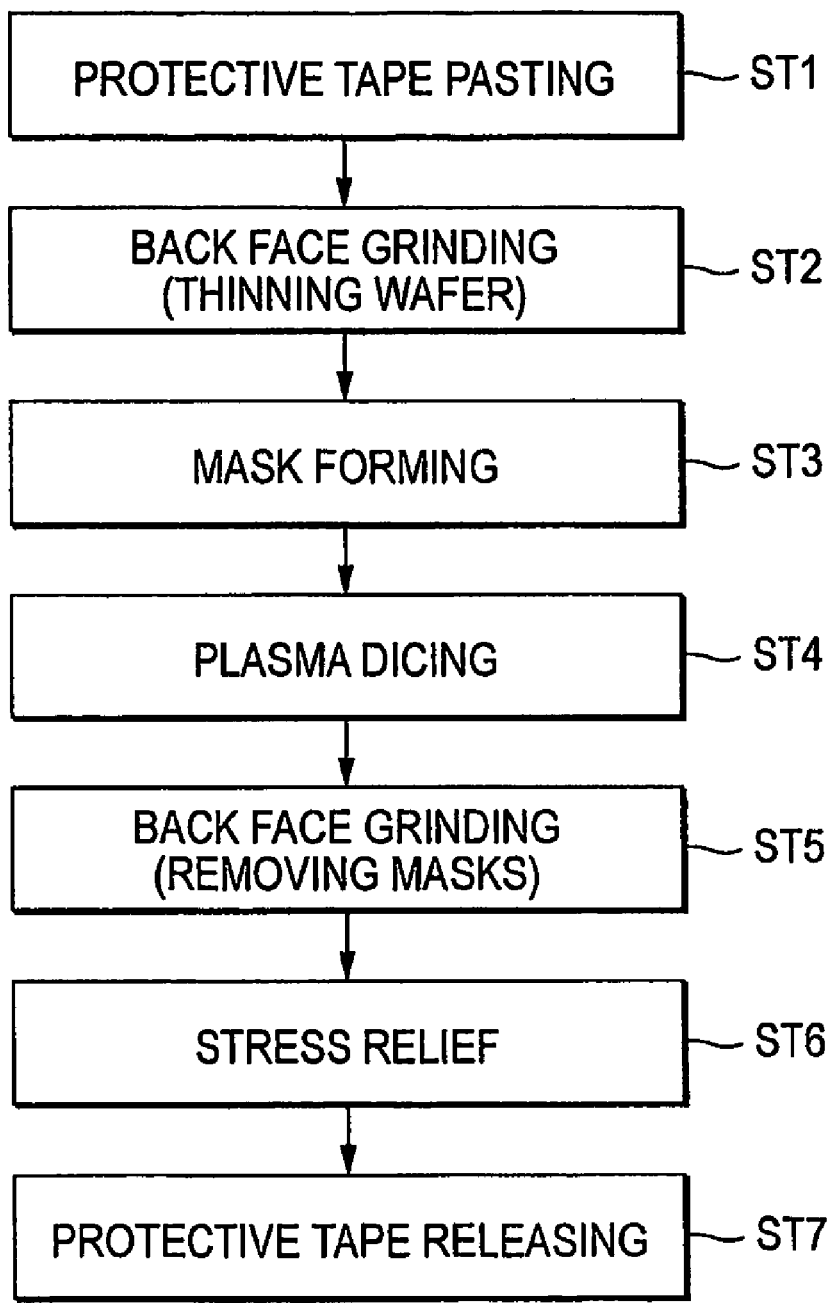
FIG. 1 is a flow chart showing a manufacturing method of semiconductor chips according to one preferred embodiment of the present invention.

A preferred embodiment of the present invention will now be described in detail with reference to the drawings. FIG. 1 is a flow chart showing a manufacturing method of semiconductor chips according to one preferred embodiment of the present invention. FIGS. 2A to 2F, 3, 4, 5 and 6 are explanatory figures showing the process of the manufacturing method of the semiconductor chips according to the embodiment of the present invention.

Referring to FIGS. 1 and 2A to 2F, the manufacturing method of the semiconductors will be described. This manufacturing method is performed by dicing individual semiconductor devices from a semiconductor wafer in which the semiconductor devices are formed respectively in plural areas partitioned by street lines.

Figure 2A:
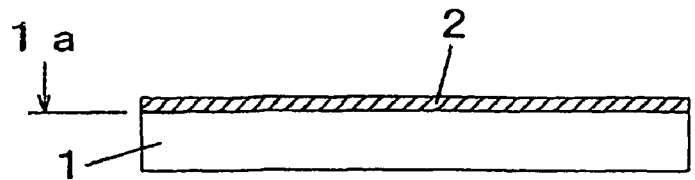
FIGS. 2A to 2F are explanatory figures showing a process of the manufacturing method of the semiconductor chips according to the embodiment of the present invention.
Figure 2B:
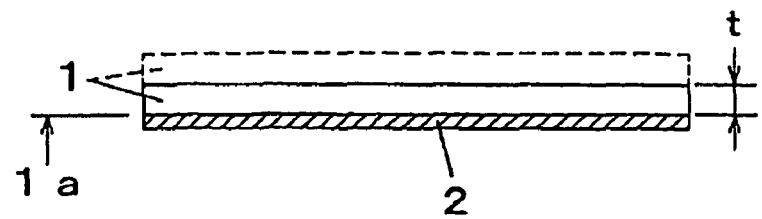
Figure 3:
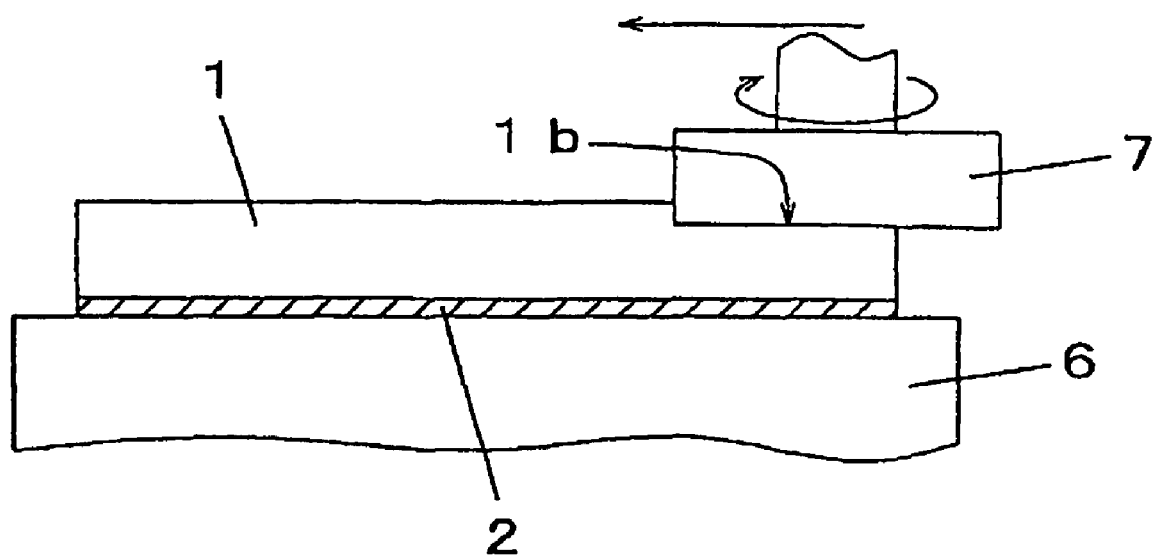
FIG. 3 is an explanatory figure showing a process of the manufacturing method of the semiconductor chips according to the embodiment of the present invention.

In FIG. 1, there is firstly executed a protective tape pasting step in which a tape for protection at mechanical grinding is pasted on a semiconductor wafer (ST1). Namely, as shown in FIG. 2A, a protective tape 2 that is capable of being peeled off is passed on a semiconductor device forming face 1a of a semiconductor wafer 1. Subsequently, a back face grinding step is executed (ST2). Namely, as shown in FIG. 3, the semiconductor wafer 1 is placed on a chuck table 6 in a posture that the side of protective tape 2 is located on the lower face. Then a side of the back face of the semiconductor wafer 1 on which the protective tape 2 is pasted is mechanically grinded by a grinding head 7 so that the semiconductor wafer 1 is thinned. As a result, the semiconductor wafer 1 which had a thickness about 750 μm originally, is thinned thickness t (about 60 μm) as shown in FIG. 2B.

Figure 2C:
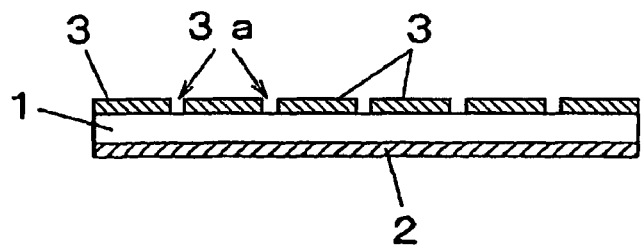
Figure 2D:
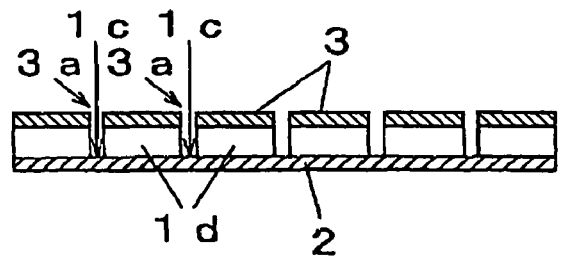

Next, a mask forming step is executed (ST3). Namely, after the back face grinding step, a resist film having a thickness about 5-20 μm is formed on the mechanically grinded face by resin film pasting or resin application by spin coating or the like. Only a part of the resist film which corresponds to street lines partitioning individual semiconductor chips is removed by a method such as a photo lithography and laser processing etc. As a result, as shown in FIG. 2C, masks for plasma dicing, namely masks 3 partitioned by street lines 3a are formed on the back face of the semiconductor wafer 1.

Figure 4:
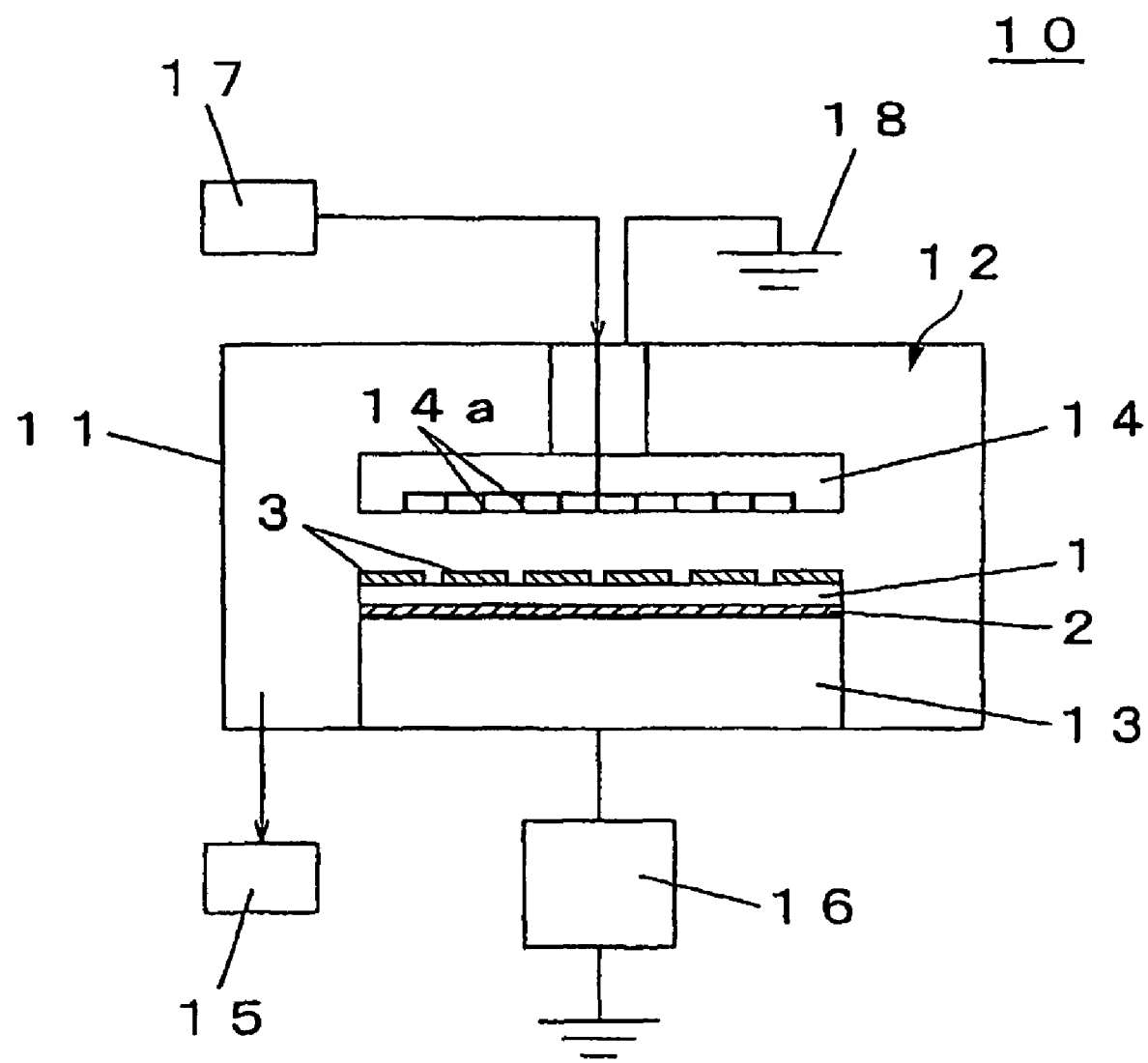
FIG. 4 is an explanatory figure showing a process of the manufacturing method of the semiconductor chips according to the embodiment of the present invention.

Subsequently, a plasma dicing step is executed (ST4). FIG. 4 shows a construction of a dry etching apparatus 10 served in the plasma dicing step. In FIG. 4, inside of a vacuum chamber 11, there is provided a processing room 12 conducting plasma processing under reduced pressure condition. By driving a vacuum evacuation device 15, the inside of the processing room 12 can be decompressed up to a pressure under which plasma processing is performed. A high frequency electrode 13 and a shower electrode 14 are provided so as to vertically oppose to each other inside of the processing room 12. On the upper face of the high frequency electrode 13, the semiconductor wafer 1 that is the object of the processing is placed in a posture that the side of the protective tape 2 is located on the lower face and the side of the masks 3 is located on the upper face.

The high frequency electrode 13 is electrically connected to a high frequency power source 16. The shower electrode 14 is grounded with a grounding portion 18. By driving the high frequency power source 16, high frequency voltage is applied between the high frequency electrode 13 and the shower electrode 14. Plural gas ejection ports 14a are formed on the lower face of the shower electrode 14. The gas ejection ports 14a are connected to a gas supply portion 17 which supplies fluorine gases for plasma processing.

At the plasma processing, the semiconductor wafer 1 is placed on the high frequency electrode 13. Then, a fluorine gas for generating plasma (in this embodiment, a mixed gas in which sulfur hexafluoride ($SF_6$) is mixed with helium gas) is blown to the semiconductor wafer 1 in the processing room 12 while the processing room 12 is evacuated in vacuum by the vacuum evacuation device 15. In this state, the high frequency voltage is applied between the high frequency electrode 13 and the shower electrode 14. As a result, fluorine radicals and ions are generated from the fluorine gas by plasma generation, and the plasma dicing is performed by a chemical action of the fluorine radicals and a physical action of the accelerated ions.

In other words, by generating the plasma of the fluorine gas to the semiconductor wafer 1, from the upper side, as shown in FIG. 3D, the part of the street lines 3a that is not covered with the masks 3 on the semiconductor wafer 1 is removed by the chemical action of the fluorine radicals and the physical action of the accelerated ions. Then, by forming dicing grooves 1c passing through the entire thickness of the semiconductor wafer 1, the semiconductor wafer 1 is divided into semiconductor chips 1d each of which corresponds to an individual semiconductor device.

Figure 5:
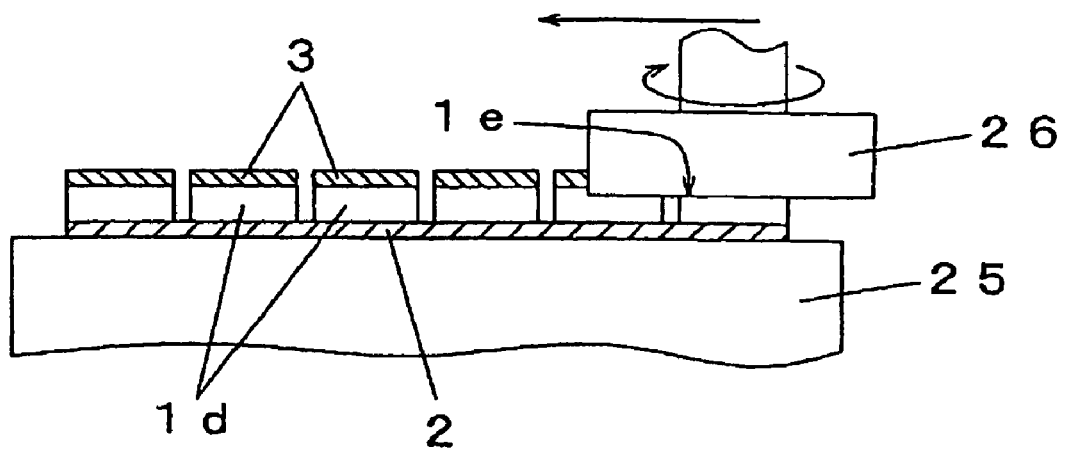
FIG. 5 is an explanatory figure showing a process of the manufacturing method of the semiconductor chips according to the embodiment of the present invention.

Subsequently a back face grinding step is executed (ST5). Namely as shown in FIG. 5, the protective tape 2 on which the semiconductor chips 1d divided into individual pieces are pasted is placed on a chuck table 25 and the masks 3 on the semiconductor chips 1d are mechanically removed by a grinding head 26 so that the semiconductor chips 1d are formed to have thickness about 55 μm. At this time, the semiconductor chips 1d are also grinded partially along with the masks 3, so that damaged layers 1e are formed in the upper face of the semiconductor chips 1d.

Figure 2E:
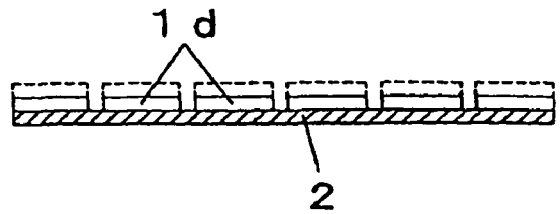
Figure 6:
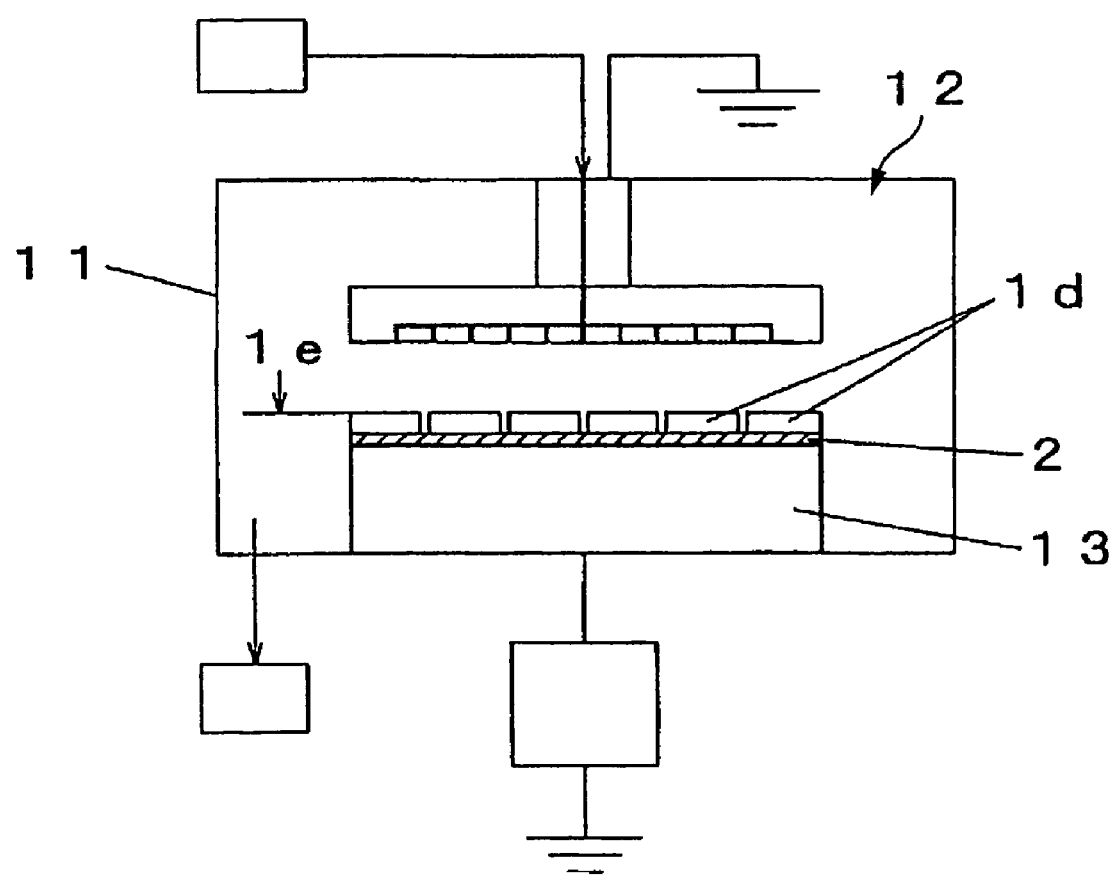
FIG. 6 is an explanatory figure showing a process of the manufacturing method of the semiconductor chips according to the embodiment of the present invention.

Next a stress relief operation to remove the damaged layers on the mechanical grinded face 1e (ST6). As shown in FIG. 6, after the back face grinding to remove the masks, the semiconductor chips 1d, as being pasted on the protective tape 2, are accommodated in the dry etching apparatus 10 again, and a plasma etching by fluorine gas is conducted on the damaged layers 1e. As a result, as shown in FIG. 2E, the damaged layers 1e remained on the upper face of the semiconductor chips 1d after removing the masks are removed, and the semiconductor chips 1d are thinned by about 50 μm.

Namely, in the stress relief operation, by conducting plasma etching on the back faces of the semiconductor chips 1d from which the masks 3 are removed, the damaged layers formed on these back faces are removed. Incidentally in this damaged layer removing step, instead of conducting plasma etching, other methods such as dry polishing, chemical polishing and wet etching etc may be conducted. However, by utilizing the same dry etching apparatus 10 which conducts the plasma dicing, the stress relief can be performed without increasing plant cost.

Figure 2F:
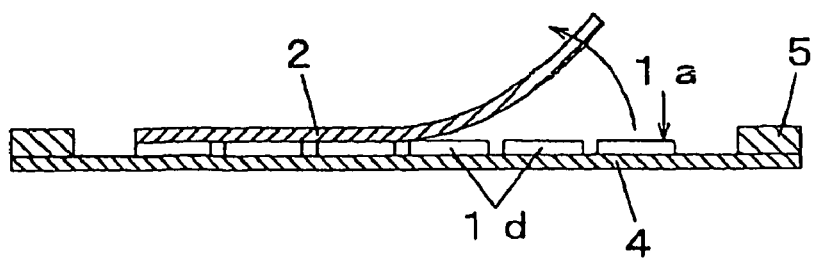

After that, releasing of the protective tape is executed (ST7). Namely as shown in FIG. 2F, the semiconductor chips 1d, as being pasted on the protective tape 2, are transferred to a dicing sheet 4 that is expanded by a wafer ring 5. Then, the semiconductor chips 1d, as being pasted on the dicing sheet 4, the protective tape 2 is released from the divided semiconductor chips 1d. As a result, the semiconductor chips 1d are in a state as being held by the dicing sheet 4, facing the semiconductor device forming face 1a upward.

As described above, in the method of manufacturing the semiconductor chips according to the embodiment of the invention, the masks formed on the semiconductor wafer for plasma dicing are removed by mechanical grinding. By this feature, it is possible to prevent generation of reaction products that must be produced inevitably when removing the masks by plasma ashing. Therefore, reaction products should not be accumulated in the plasma processing apparatus so that the dicing can be performed without causing quality deterioration due to the accumulated particles.

INDUSTRIAL APPLICABILITY

The method of manufacturing the semiconductor devices according to the invention is an advantageous in that the dicing can be conducted without causing quality deterioration due to the accumulated particles by preventing generation of reaction products when removing the masks, and therefore applicable in a field of manufacturing semiconductor chips by dicing individual semiconductor devices from a semiconductor wafer in which the semiconductor devices are formed.

The invention claimed is:

1. A method of manufacturing semiconductor chips by dicing individual semiconductor devices from a semiconductor wafer in which the semiconductor devices are formed respectively in plural areas partitioned by street lines, comprising the steps of:

a protective tape pasting step of pasting a protective tape, capable of being peeled off, on a semiconductor device forming face of a semiconductor wafer;

a back face grinding step of grinding a back face opposite to the face of the semiconductor wafer on which the protective tape is pasted so as to thin the semiconductor wafer;

a mask forming step of forming masks covering the plural areas on the back face of the semiconductor wafer after the back face grinding step;

a plasma dicing step of dicing the semiconductor wafer into plural semiconductor chips each of which corresponds to an individual semiconductor device by generating plasma from a side of the semiconductor wafer on which the masks are formed to remove a portion of the semiconductor wafer which is not covered with the masks;

a mask removing step of removing the masks by grinding the back face on which the masks are formed after the plasma dicing step, wherein the semiconductor chips are partially grinded along with the masks during removing the masks to form damaged layers;

a damaged layer removing step of removing the damaged layers formed by partially grinding the semiconductor chips along with the masks in the mask removing step; and a tape releasing step of releasing the protective tape from the diced semiconductor chips, wherein the damaged layers formed on the back face are removed by plasma etching in the damaged layer removing step.

* * * * *